United States Patent
Chen et al.

(10) Patent No.: US 8,140,944 B2
(45) Date of Patent: Mar. 20, 2012

(54) INTERLEAVER DESIGN WITH UNEQUAL ERROR PROTECTION FOR CONTROL INFORMATION

(75) Inventors: Runhua Chen, Dallas, TX (US); Zukang Shen, Richardson, TX (US); Eko Nugroho Onggosanusi, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 729 days.

(21) Appl. No.: 12/357,500

(22) Filed: Jan. 22, 2009

(65) Prior Publication Data

US 2009/0199055 A1 Aug. 6, 2009

Related U.S. Application Data

(60) Provisional application No. 61/023,240, filed on Jan. 24, 2008, provisional application No. 61/030,691, filed on Feb. 22, 2008, provisional application No. 61/039,565, filed on Mar. 26, 2008, provisional application No. 61/048,390, filed on Apr. 28, 2008.

(51) Int. Cl.
*H03M 13/00* (2006.01)
(52) U.S. Cl. ........ 714/776; 714/701
(58) Field of Classification Search .......... 714/776, 714/701
See application file for complete search history.

(56) References Cited

U.S. PATENT DOCUMENTS 6,971,050 B1 * 11/2005 Ohbuchi et al. ............ 714/701
2005/0246617 A1 * 11/2005 Kyung et al. ............... 714/801
2008/0080470 A1 * 4/2008 Yano et al. .................. 370/342

OTHER PUBLICATIONS

3GPP, "3rd Generation Partnership Project; Technical Specification Group Radio Access Network; Evolved Universal Terrestrial Radio Access (E-UTRA); Physical Channels and Modulation", 3GPP TS 36.211, Release 8, V8.4.0, Valbonne, France, Sep. 2008, pp. 1-80.
3GPP, "3rd Generation Partnership Project; Technical Specification Group Radio Access Network; Evolved Universal Terrestrial Radio Access (E-UTRA); Multiplexing and Channel Coding", 3GPP TS 36.212, Release 8, V8.4.0, Valbonne, France, Sep. 2008, pp. 1-56.
3GPP, "3rd Generation Partnership Project; Technical Specification Group Radio Access Network; Evolved Universal Terrestrial Radio Access (E-UTRA); Physical Layer Procedures", 3GPP TS 36.213, Release 8, V8.4.0, Valbonne, France, Sep. 2008, pp. 1-60.

* cited by examiner

*Primary Examiner* — M. Mujtaba K Chaudry
(74) *Attorney, Agent, or Firm* — Robert D. Marshall, Jr.; W. James Brady; Frederick J. Telecky, Jr.

(57) ABSTRACT

For transmission of a block of control information within a wireless network, the control information is interleaved to form an ordered set of control bits, wherein more important information bits of the control information are placed into a first portion of the ordered set of control bits, with less important information bits of the control information placed into a second portion of the ordered set of controls bits. The ordered set of control bits is encoded to form an encoded block of data. The encoded block of data is transmitted to a serving base station, wherein bits from the first portion of the ordered set of control bits will statistically have a lower bit error rate (BER) than bits from the second portion of the ordered set of control bits during transmission.

21 Claims, 6 Drawing Sheets

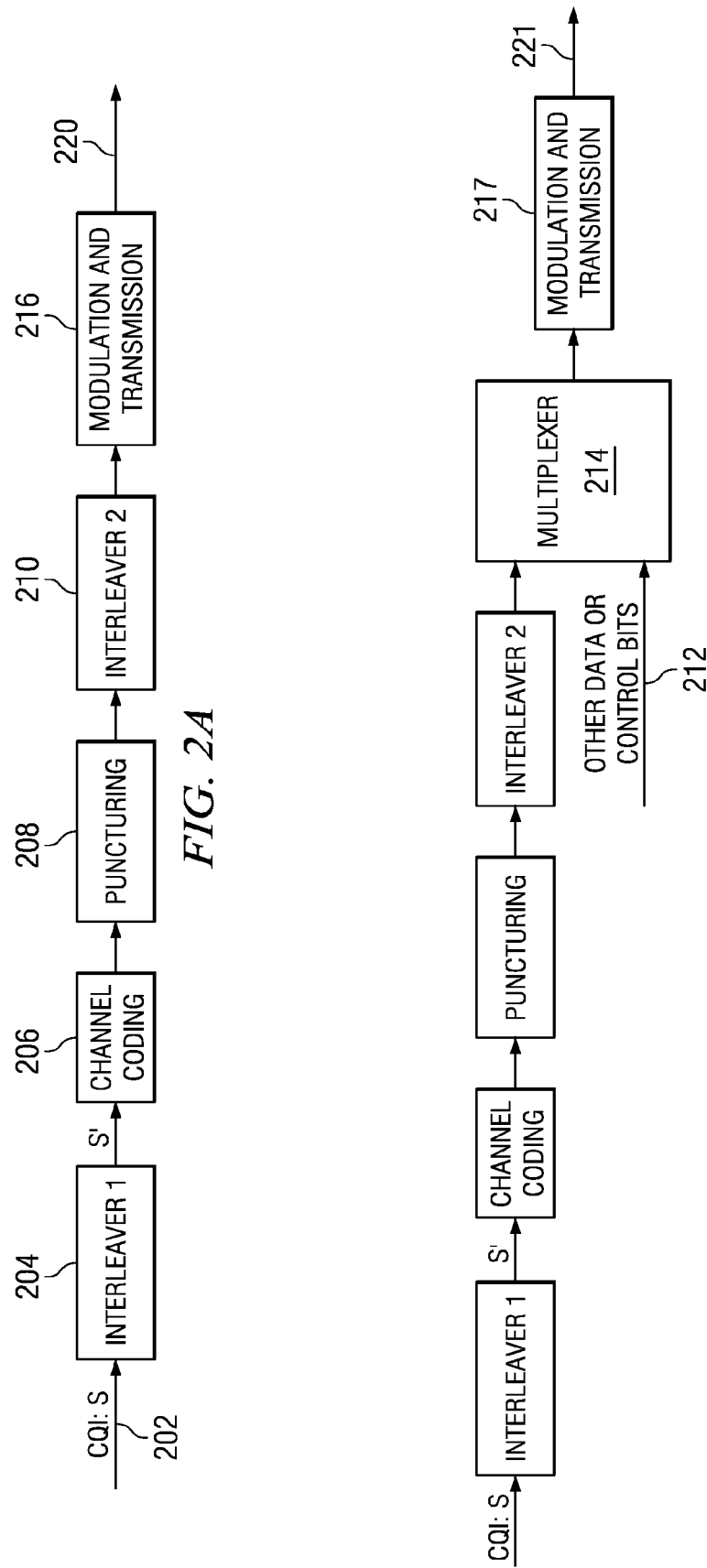

INTERLEAVER DESIGN WITH UNEQUAL ERROR PROTECTION FOR CONTROL INFORMATION

CLAIM OF PRIORITY UNDER 35 U.S.C. 119(e)

This application for patent claims priority to U.S. Provisional Application No. 61/023,240 entitled "Interleaver Design with Unequal Error Protection for Channel Quality Indicator" filed Jan. 24, 2008, which is incorporated by reference herein. This application for patent also claims priority to U.S. Provisional Application No. 61/030,691 entitled "Interleaver Design with Unequal Error Protection for Channel Quality Indicator" filed Feb. 22, 2008, which is incorporated by reference herein. This application for patent also claims priority to U.S. Provisional Application No. 61/039,565 entitled "Interleaver Design with Unequal Error Protection for Channel Quality Indicator" filed Mar. 26, 2008, which is incorporated by reference herein. This application for patent also claims priority to U.S. Provisional Application No. 61/048,390 entitled "Interleaver Design with Unequal Error Protection for Channel Quality Indicator" filed Apr. 28, 2008, which is incorporated by reference herein.

FIELD OF THE INVENTION

This invention generally relates to wireless communication, and in particular to blocks of data using forward error detection (FEC) in orthogonal frequency division multiple access (OFDMA), DFT-spread OFDMA, and single carrier frequency division multiple access (SC-FDMA) systems.

BACKGROUND OF THE INVENTION

Wireless cellular communication networks incorporate a number of mobile UEs and a number of NodeBs. A NodeB is generally a fixed station, and may also be called a base transceiver system (BTS), an access point (AP), a base station (BS), or some other equivalent terminology. As improvements of networks are made, the NodeB functionality evolves, so a NodeB is sometimes also referred to as an evolved NodeB (eNB). In general, NodeB hardware, when deployed, is fixed and stationary, while the UE hardware is portable.

In contrast to NodeB, the mobile UE can comprise portable hardware. User equipment (UE), also commonly referred to as a terminal or a mobile station, may be fixed or mobile device and may be a wireless device, a cellular phone, a personal digital assistant (PDA), a wireless modem card, and so on. Uplink communication (UL) refers to a communication from the mobile UE to the NodeB, whereas downlink (DL) refers to communication from the NodeB to the mobile UE. Each NodeB contains radio frequency transmitter(s) and the receiver(s) used to communicate directly with the mobiles, which move freely around it. Similarly, each mobile UE contains radio frequency transmitter(s) and the receiver(s) used to communicate directly with the NodeB. In cellular networks, the mobiles cannot communicate directly with each other but have to communicate with the NodeB.

Control information feedback bits are transmitted, for example, in the uplink (UL), for several purposes. For instance, Downlink Hybrid Automatic Repeat ReQuest (HARQ) requires at least one bit of ACK/NACK transmitted in the uplink, indicating successful or failed circular redundancy check(s) (CRC). Moreover, a one bit scheduling request indicator (SRI) is transmitted in uplink, when UE has new data arrival for transmission in uplink. Furthermore, an indicator of downlink channel quality (CQI) needs to be transmitted in the uplink to support mobile UE scheduling in the downlink. While CQI may be transmitted based on a periodic or triggered mechanism, the ACK/NACK needs to be transmitted in a timely manner to support the HARQ operation. Note that ACK/NACK is sometimes denoted as ACK-NAK or just simply ACK, or any other equivalent term. This uplink control information is typically transmitted using the physical uplink control channel (PUCCH), as defined by the 3GPP working groups (WG), for evolved universal terrestrial radio access (EUTRA). The EUTRA is sometimes also referred to as 3GPP long-term evolution (3GPP LTE). The structure of the PUCCH is designed to provide sufficiently high transmission reliability.

In addition to PUCCH, the EUTRA standard also defines a physical uplink shared channel (PUSCH), intended for transmission of uplink user data. Since PUSCH is designed for transmission of user data, re-transmissions are possible, and PUSCH is expected to be generally scheduled with less stand-alone sub-frame reliability than PUCCH.

Similarly, a physical downlink control channel (PDCCH) and a physical downlink shared channel (PDSCH) are defined for downlink control and data transfers. The modulation schemes supported in the downlink and uplink shared channels are QPSK, 16QAM and 64QAM, depending on channel conditions. The general operations of the physical channels are described in the EUTRA specifications, for example: "$3^{rd}$ Generation Partnership Project; Technical Specification Group Radio Access Network; Evolved Universal Terrestrial Radio Access (E-UTRA); Physical Channels and Modulation (TS36.211, Release 8)."

Error-control coding techniques detect and possibly correct errors that occur when messages are transmitted in PUSCH and PDSCH. To accomplish this, the encoder transmits not only the information symbols but also extra redundant parity symbols. The decoder interprets what it receives, using the redundant symbols to detect and possibly correct whatever errors occurred during transmission.

Block coding is a special case of error-control coding. Block-coding techniques map a fixed number of message symbols to a fixed number of code symbols. A block coder treats each block of data independently and is a memory-less device. The information to be encoded consists of message symbols and the code that is produced consists of codewords. Each block of K message symbols is encoded into a codeword that consists of N message symbols. K is called the message length, N is called the codeword length, and the code is called an [N,K] code.

Turbo codes are a class of high-performance error correction codes developed in 1993 which are finding use in deep space satellite communications and other applications where designers seek to achieve maximal information transfer over a limited-bandwidth communication link in the presence of data-corrupting noise. The channel coding scheme for transport blocks in LTE is Turbo Coding with a coding rate of R=⅓, using two 8-state constituent encoders and a contention-free quadratic permutation polynomial (QPP) turbo code internal interleaver. Trellis termination is used for the turbo coding. Before the turbo coding, transport blocks are segmented into byte aligned segments with a maximum information block size of 6144 bits. Error detection is supported by the use of 24 bit CRC. The ⅓ coding rate triples the bit-count for transmission of the block. The general operations of channel coding are described in the EUTRA specifications, for example: "$3^{rd}$ Generation Partnership Project; Technical Specification Group Radio Access Network; Evolved Universal Terrestrial Radio Access (E-UTRA); Multiplexing and channel coding (TS36.212, Release 8)."

BRIEF DESCRIPTION OF THE DRAWINGS

Particular embodiments in accordance with the invention will now be described, by way of example only, and with reference to the accompanying drawings:

FIGS. 2A and 2B are block diagrams illustrating CQI transmission in the network of FIG. 1;

DETAILED DESCRIPTION OF EMBODIMENTS OF THE INVENTION

Figure 1:
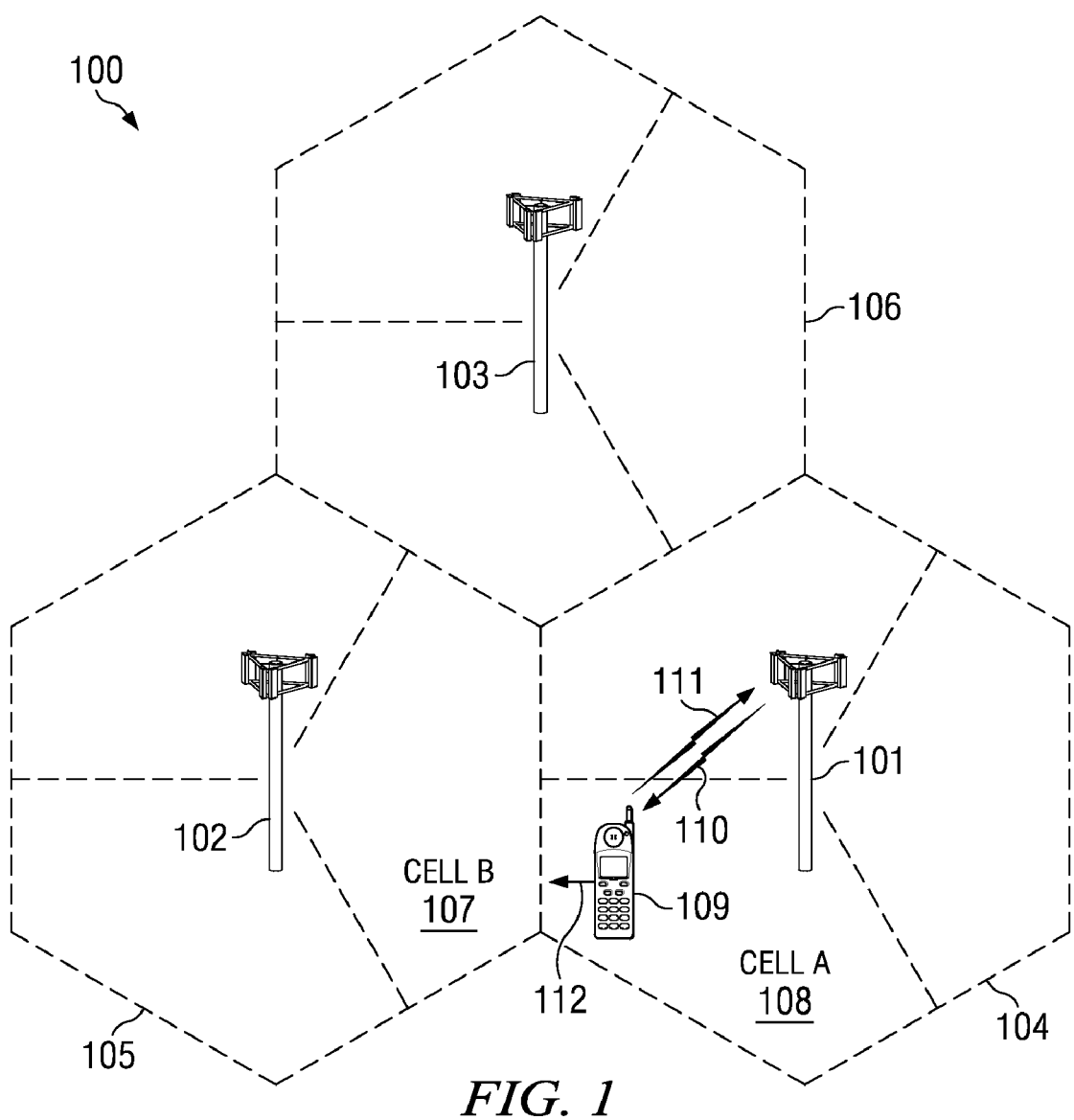
FIG. 1 is a pictorial of an illustrative telecommunications network that employs an embodiment of restricted feedback in the physical uplink control channel (PUCCH)

A key principle in orthogonal frequency division multiple access (OFDMA) communication systems is that the total operating bandwidth is divided into non-overlapping resource blocks (RB) where transmissions from user equipments (UEs) occur in an orthogonal, not mutually interfering, manner. Each RB could potentially carry data to a different UE. More typically, each UE will get a well-chosen set of resources, where it has a high signal-to-interference and noise ratio (SINR) so that the spectral efficiency of the transmission is maximized according to the operating principle of a scheduler.

To enable near-optimum frequency domain scheduling, each UE needs to feedback the SINR or channel quality indicator (CQI) it experiences, potentially for each sub-band which consists of several RBs, to its serving base station (Node B). Clearly, it is beneficial to use efficient CQI feedback techniques to compress the amount of overhead incurred. This can be done by using the fact that CQI feedback across multiple sub-bands is often heavily correlated. Embodiments of the invention exploit this channel property and propose specific methods to reduce the CQI feedback overhead in the uplink (UL). The UL refers to the communication from UEs to their serving Node B.

In multiple-input, multiple-output (MIMO) spatial multiplexing systems transmission in downlink (DL), several control signals must be fed back in uplink (UL). For example, MIMO related feedback information includes:

The optimal transmission rank, i.e., the number of spatial layers to be multiplexed The channel quality for each codeword Precoding matrix index (PMI), in the case of preceding based closed-loop MIMO In general, we refer these control signals as channel quality indicators (CQI). Typically, some coding scheme, e.g. convolutional coding, block coding, etc., is applied to CQI to provide reliable transmission. It is common that for any coding scheme, some information bits have more protection than the others, due to the coding structure and properties. On the other hand, some of the CQI information bits are more important than the others. For instance, assume four bits are used to represent different modulation and coding schemes (MCS). In other words, 16 MCS values are possible. Without loss generality, assuming the 16 MCS are in ascending order in terms of data rate, and the corresponding (1-to-1 mapped) four MCS bits are also in ascending order (in terms of its decimal value). The most significant bit of the four MCS bits is more important than the least significant bit, because an error in the most significant bit has larger impact on the received MCS value and on the throughput than the error in the least significant bit.

In this disclosure, a method of encoding CQI with more protection to the more important CQI information bits is described. For single transmit antenna and transmit diversity (TxD) systems, only one spatial codeword (CW) is transmitted and CQI refers to the channel quality indicator exclusively. For MIMO spatial multiplexing (SM) systems which potentially have multiple CWs, CQI refers to rank, PMI and channel quality indicator. It is noted that the proposed method also applies to the transmission of other control signals or data as well.

More error protection should be assigned to more important bits. Specifically, ACK/NAK and Rank bits are more important than other CQI bits and should be assigned to bit position with more error protection. Wideband CQI is more important than sub-band differential CQI, and should be assigned to bit position with more error protection than sub-band differential CQI (e.g. UE-selected and higher-layer configured CQI). Channel quality of codewords is more important than PMI and needs more error protection than PMI. For rank>1 MIMO feedback, the CQI of the $1^{st}$ codeword (reference CQI) is more important than the CQI of the $2^{nd}$ codeword, and should be assigned to bit position with more error protection than the CQI of the $2^{nd}$ codeword. For UE-selected CQI feedback, the indicator of the positions of the best-M sub-bands is more important than the best-M average CQI/PMI, and therefore should be more protected. In another embodiment where the differentially encoded best-M average CQI has a large bit-width and consequently large dynamic range, the best-M average CQI is considered more important than the indicator of the positions of the best-M sub-bands, and hence should be more protected.

FIG. 1 shows an exemplary wireless telecommunications network 100. The illustrative telecommunications network includes representative base stations 101, 102, and 103; however, a telecommunications network necessarily includes many more base stations. Each of base stations 101, 102, and 103 are operable over corresponding coverage areas 104, 105, and 106. Each base station's coverage area is further divided into cells. In the illustrated network, each base station's coverage area is divided into three cells. Handset or other UE 109 is shown in Cell A 108, which is within coverage area 104 of base station 101. Base station 101 is transmitting to and receiving transmissions from UE 109 via downlink 110 and uplink 111. As UE 109 moves out of Cell A 108, and into Cell B 107, UE 109 may be handed over to base station 102. Because UE 109 is synchronized with base station 101, UE 109 must employ non-synchronized random access to initiate handover to base station 102. A UE in a cell may be stationary such as within a home or office, or may be moving while a user is walking or riding in a vehicle. UE 109 moves within cell 108 with a velocity 112 relative to base station 102.

CQI reports are provided by UE 109 to the controlling base station, such as base station 101 via uplink 111 using an interleaving and coding scheme which is described in more detail below.

FIGS. 2A and 2B show exemplary block diagrams of CQI and/or other data/control transmission schemes. In FIG. 2a, the uncoded CQI information bits 202 are interleaved by interleaver logic 204, followed by a channel coding scheme 206. The coded CQI bits are punctured 208, depending on the assigned or available resources for CQI transmission. Interleaver 2 logic block 210 provides protection for impulse or bursty interference or noise. Modulation and transmission block 216 then transmits the encoded block of data 220, using generally known techniques.

Referring to FIG. 2B, if other coded or uncoded data and/or control bits 212 are to be included in the block, they are multiplexed 214 with the interleaved and coded CQI bits, before the modulation and transmission logic 217. Note that the multiplexing of CQI and other data/control bits can be in the time, frequency, or code domain, or the combination thereof using generally known techniques. Modulation and transmission block 217 then transmits the encoded block of data 221, using generally known techniques.

Without loss of generality, assume a (m, n) channel coding scheme for CQI, where n ($\leq$m) is the number of CQI information bits and m is the number of coded CQI bits. Furthermore, assume p coded CQI bits are punctured, thus the coded CQI length at the output of puncturing logic 208 is (m—p).

Without loss of generality, denote the interleaved CQI information bits S' as [s1', s2', . . . , sn']. Moreover, denote the associated bit error rate (BER) for each element in S' as [b1, b2, . . . , bn]. Due to the properties of channel coding logic 206 and puncturing logic 208, it is not necessary that all elements in S' have the same bit error rate. Without loss of generality, assume b1$\leq$b2$\leq$ . . . $\leq$bn. In other words, bit s1' is the most protected and sn' is the lest protected bit. It can also be assumed that some metric can be associated with each CQI information bit in S, to measure the importance of the associated CQI information bit. In essence, embodiments of the current invention may map the most important CQI information bit in S to the most protected bit in S', and map the rest of the CQI information bits in S in a similar way to the bits in S'. In other words, the disclosed method provides unequal protection to CQI information bits. Consequently, the more important the CQI information bit is, the more protected it is. The associated mapping can be implemented in the interleaver 1 logic block 204.

This disclosure takes CQI as an exemplary control signal that needs unequal protection. It is not precluded that the proposed method can be applied to other control signals and/or data, which can be jointly or separately coded with CQI. Moreover, the definition of the importance metric associated to the information bit can vary depending on the type of CQI information and/or other control/data signals. It is not precluded that the definition of the importance metric can be user specific, user group specific, cell specific, NodeB specific or common to all users in the system.

In the following sections, design formats on the interleaved information bits S' are proposed for single transmit antenna and MIMO spatial multiplexing systems. The following notations are used:

N: bit-length of wideband CQI, e.g., N=4 x: bit-length of sub-band (frequency) differential CQI, e.g., x=2 d: bit-length of spatial differential CQI, e.g., d=3 r: bit-length of rank feedback, e.g., r=1 for 2×2 and 4×2 MIMO, r=2 for 4×4 MIMO L: number of sub-bands p: bit-length for PMI feedback, e.g., p=4 for 4TX MIMO with 16 codewords in each rank codebook.

Single Transmit Antenna and Transmit Diversity (TxD)

Only one CW is transmitted in a single transmit antenna and TxD system, or when rank=1 in a closed-loop MIMO SM system. A single wideband CQI value is reported for the entire system bandwidth. The wideband CQI is reported with full bit-length of N-bits, denoted as [WB$_1$', WB$_2$', . . . , WB$_N$'] where WB$_1$ is the most significant bit (MSB) and WB$_N$ is the least significant bit (LSB). In this case, it is proposed to allocate more error protection to the most significant bit, and less error protection to the less significant bit. In other word, it is proposed that the wideband CQI control information be interleaved to form an ordered set of bits as follows:

$$[WB_1', WB_2', \ldots, WB_N']=[s_1', s_2', \ldots, s_n'] \qquad (1)$$

Figure 3A:
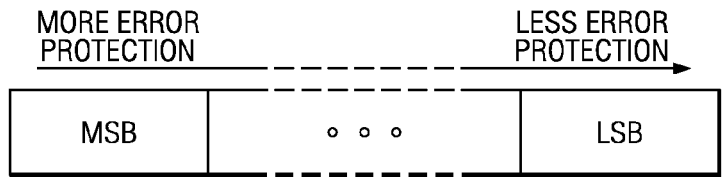
FIGS. 3A-3D are block diagrams illustrating varying levels of error protection with exemplary mapping of control information in a single transmit antenna embodiment.

FIG. 3A illustrates the general idea of mapping the MSB of the wideband CQI to the more error protected portion of the ordered sequence S' and mapping the less important LSB to the less error protected portion of sequence S'.

UE-Selected CQI Feedback

The following values are reported to the eNB by a UE:

Wideband CQI: reported with full bit-length as [WB$_1$', WB$_2$', . . . , WB$_N$']

A single average CQI (e.g, best-M CQI) for a set of selected M sub-bands assuming transmission only over the selected M sub-bands. Furthermore, frequency differential quantization can be applied where the difference between the best-M average CQI and the wideband CQI is sent to eNB using x-bits, x<=N. The best-M differential CQI bit sequence is denoted as [BM$_1$', BM$_2$', . . . , BM$_x$']

An indicator of the position of the selected best-M sub-band using k-bits. The bit sequence is denoted as [P$_1$', P$_2$', . . . , P$_k$'] where P$_1$ is the MSB and P$_k$ is the LSB.

Figure 3B:

In one embodiment, the most error protection is allocated to the wideband CQI because it serves as a reference and impacts the entire system bandwidth. The indication of the best-M sub-band position is the next most important value, as it specifies where the best-M sub-band should be scheduled. If the position indicator is decoded erroneously, eNB scheduling will be sub-optimal where higher MCS is used on a bandwidth part with worse channel condition, resulting in too aggressive link adaptation. Thus, one proposed CQI interleaver design is given in equation (2) with an exemplary diagram depicted in FIG. 3B.

$$[WB_1', WB_2', \ldots, WB_N', P_1', P_2', \ldots, P_k', BM_1', BM_2', \ldots, BM_x']=[s_1', s_2', \ldots, s_n'] \qquad (2)$$

Figure 3C:

On the other hand, it is not precluded to allocate more error protection to the best-M average CQI than to the labeling of the best-M sub-bands position. In this case the CQI interleaver could be designed as in Equation (3), where an exemplary diagram is shown in FIG. 3C.

$$[WB_1', WB_2', \ldots, BM_1', BM_2', \ldots, BM_x', WB_N', P_1', P_2', \ldots, P_k']=[s_1', s_2', \ldots, s_n'] \qquad (3)$$

eNB Configured CQI Feedback

The following values are reported in the eNB/higher-layer configured CQI feedback: wideband CQI: reported with full bit-length as [WB$_1$', WB$_2$', . . . , WB$_N$']. Suppose the system bandwidth or a fraction of the system bandwidth configured for CQI feedback is divided into L sub-bands. One sub-band CQI is reported for each sub-band of the L sub-bands, which is encoded differentially with respect to the wideband CQI used as a reference. For the k-th sub-band, the bit sequence of the differential CQI is given as [CQI$_1$(k)', CQI$_2$(k)', . . . , CQI$_x$(k)']. Hence, one example to design the CQI interleaver is in Equation (4a)

$$[WB_1', WB_2', \ldots, WB_N', CQI_1(1)', \ldots CQI_x(1)',\\ CQI_1(2)', \ldots CQI_x(L)', \ldots CQI_1(L)', \ldots CQI_x\\ (L)']=[s_1', s_2', \ldots, s_n'] \quad (4a)$$

Figure 3D:
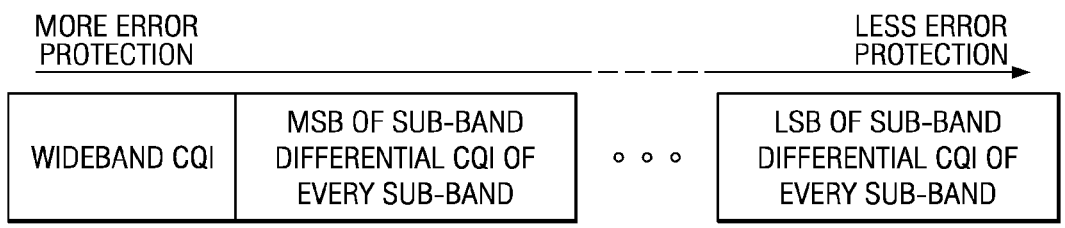

In another embodiment, the most error protection is allocated to the wideband CQI because it serves as a reference to the sub-band CQI and impacts the entire system bandwidth. Next, the most significant bit of each sub-band CQI are equally important, followed by the $2^{nd}$ most significant bit, the $3^{rd}$ most important bits, so on and so forth. Therefore, one could design the CQI interleaver as in Equation (4) where an exemplary diagram is given in FIG. 3D.

$$[WB_1', WB_2', \ldots, WB_N', CQI_1(1)', \ldots CQI_1(L)',\\ CQI_2(1)', \ldots CQI_2(L)', \ldots CQI_x(1)', \ldots\\ CQI_x(L)']=[s_1', s_2', \ldots, s_n']$$

Closed-Loop MIMO SM Systems

For closed-loop MIMO systems with multiple CWs multiplexed in the spatial domain, the following quantities are to be reported to the serving eNB The transmission rank, denoted as $[R_1', R_2', \ldots, R_r']$ The channel quality for each codeword Precoding matrix index (PMI), in the case of precoding based closed-loop MIMO, denoted as [PMI$_1'$, PMI$_2'$, . . . , PMI$_P'$]

In the case of a single wideband PMI report, [PMI$_1'$, PMI$_2'$, . . . , PMI$_P'$] correspond to the single wideband PMI ordered from MSB to LSB, for the entire system bandwidth or a fraction of the system bandwidth to which the PMI report corresponds, In the case of sub-band PMI report where L sub-band PMIs are reported, [PMI$_1'$, PMI$_2'$, . . . , PMI$_P'$] is the concatenation of the PMIs from the $1^{st}$ sub-band to the $L^{th}$ subband, where each sub-band PMI is ordered from MSB to LSB.

If a CQI quantity (e.g., rank, channel quality, or PMI) is not required to be reported, the corresponding CQI quantity is dropped in the following discussion.

In the following paragraphs, different interleaver designs are proposed based on the CQI report formats for closed-loop MIMO SM systems. Note that in this example, two codewords are assumed for the system. It is not precluded to apply the following schemes to MIMO SM systems with more than two codewords.

The wideband CQI of the $1^{st}$ codeword is reported with N-bits denoted as [WB$_1'$(1), WB$_2'$(1)', . . . , WB$_N'$(1)'] in the order from the MSB to the LSB. The wideband CQI of the $2^{nd}$ codeword is reported differentially with respect to the wideband CQI of the $1^{st}$ codeword using d-bits, denoted as [WB$_1'$(2), . . . , WB$_d$(2)']. The CQI of the $1^{st}$ codeword is more important because it serves as a reference of the $2^{nd}$ codeword CQI.

Figure 4A:
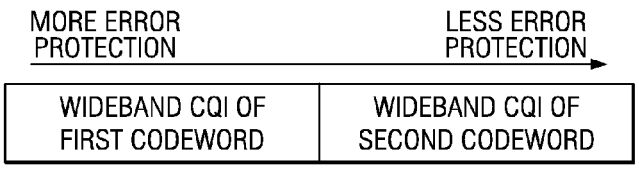
FIGS. 4A-4D are block diagrams illustrating varying levels of error protection with exemplary mapping of control information in a multi transmit antenna embodiment.

Hence, one embodiment of the CQI interleaver is given in Equation (5), with an exemplary diagram in FIG. 4A.

$$[WB_1'(1), WB_2(1)', \ldots, WB_N(1)', WB_1'(2), \ldots, WB_d\\ (2)']=[s_1', s_2', \ldots, s_n'] \quad (5)$$

Figure 4B:
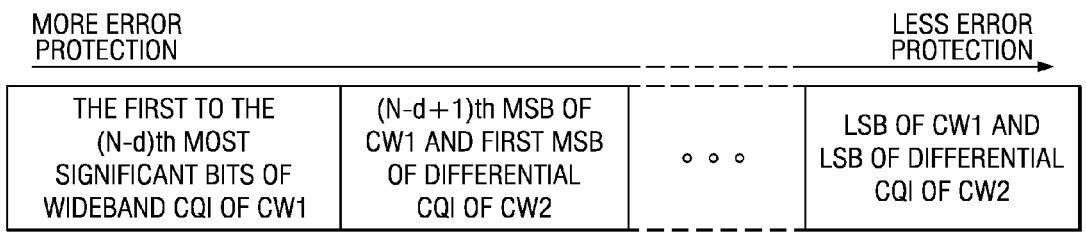

Another possible embodiment of the interleaver is to allocate the same error protection to the wideband CQI bits of different codewords at the same bit position as shown in equation (6), where an example is shown in FIG. 4B.

$$[WB_1'(1), WB_2(1)', \ldots WB_{N-d+1}(1)', WB_1(2)',\\ WB_{N-d+2}(1)', WB_2(2)' \ldots, WB_N(1)', WB_d(2)']=\\ [s_1', s_2', \ldots, s_n'] \quad (6)$$

Figure 4C:
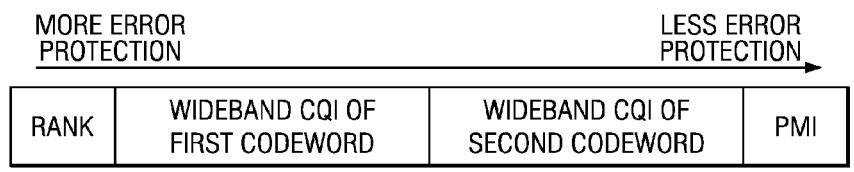

If wideband CQI is encoded jointly with rank and PMI, more error protection should be given to rank while less error protection should be given to PMI. As a result, one possible design of the interleaved bit sequence is shown in equation (7) and illustrated in FIG. 4C.

$$[R_1', R_2', \ldots, R_r', WB_1'(1), \ldots, WB_N(1)',\\ WB_1'(2), \ldots, WB_d(2)', PMI_1', \ldots, PMI_P']=[s_1',\\ s_2', \ldots, s_n'] \quad (7)$$

Figure 4D:
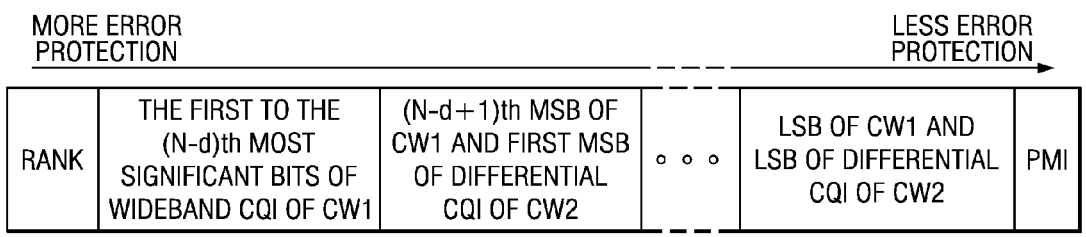

Another embodiment for when wideband CQI is encoded jointly with rank and PMI is shown in equation (8) and illustrated in FIG. 4D.

$$[R_1', \ldots, R_r', WB_1'(1), \ldots WB_{N-d+1}(1)', WB_1(2)',\\ WB_{N-d+2}(1)', WB_2(2)' \ldots, WB_N(1)', WB_d(2)',\\ PMI_1', \ldots, PMI_P']=[s_1', s_2', \ldots, s_n'] \quad (8)$$

eNB Configured CQI Feedback

The following values are reported in the eNB/higher-layer configured CQI feedback:

Wideband CQI: The wideband CQI of the $1^{st}$ codeword is reported with N-bits denote as [WB$_1'$(1), WB$_2'$(1)', . . . , WB$_N'$(1)']. The wideband CQI of the $2^{nd}$ codeword is reported differentially with respect to the wideband CQI of the $1^{st}$ codeword using d-bits, denoted as [WB$_1'$(2), . . . , WB$_d$(2)'].

For each codeword, CQI of each sub-band is encoded differentially with respect to the wideband CQI. For the r-th codeword on the k-th sub-band, the bit sequence of the frequency differential CQI is given as [CQI$_1$(r, k)', CQI$_2$(r, k)', . . . , CQI$_x$(r, k)'].

The wideband CQI should be given more error allocation because it serves as a reference to the sub-band CQI. The wideband CQI of the $1^{st}$ codeword should be given more error protection than the wideband of the $2^{nd}$ codeword, because it serves as the reference for both (1) frequency differential CQI of the $1^{st}$ codeword, and (2) wideband CQI of the $2^{nd}$ codeword, (3) sub-band CQI of the $2^{nd}$ codeword. As of sub-band CQI at the same bit-location, the frequency differential CQI bit of the $2^{nd}$ codeword can be given more error protection than the frequency differential CQI bit of the $1^{st}$ codeword, if the wideband CQI of the $2^{nd}$ codeword is encoded differentially w.r.t. the wideband CQI of the $1^{st}$ codeword. Otherwise, the frequency differential CQI bits of the $1^{st}$ codeword can be given more error protection than the frequency differential CQI bits of the $2^{nd}$ codeword. As a result, one embodiment is shown in equation (9).

$$[\{\text{wideband CQI}\}, \{\text{sub-band differential CQI}\}]=[s_1',\\ s_2', \ldots, s_n'] \quad (9)$$

where {wideband CQI} is the bit-sequence in reporting the wideband CQI of two codewords as shown in any of equations (5)-(8) above. {sub-band differential CQI} is the bit-sequence in reporting the sub-band CQI of two codewords.

Figure 5A:
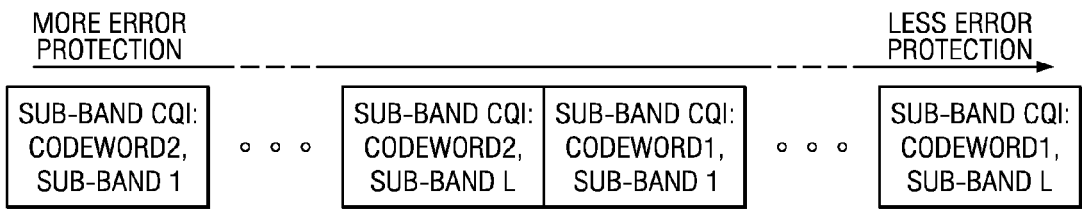
FIGS. 5A-5C are exemplary resource allocations by a base station in which more important control information is mapped the resource with more error protection.

Therefore, one possible design of {sub-band differential CQI} is shown in equation (10) and illustrated in FIG. 5A.

$$\{\text{sub-band differential CQI}\}=[CQI_1(1,1)' \ldots CQI_x(1,\\ 1)', \ldots CQI_1(1,L)', \ldots CQI_x(1,L)', \ldots CQI_1\\ (2,1)' \ldots CQI_x(2,1)', \ldots CQI_1(2,L)', \ldots CQI_x(2,\\ L)'] \quad (10)$$

Figure 5B:
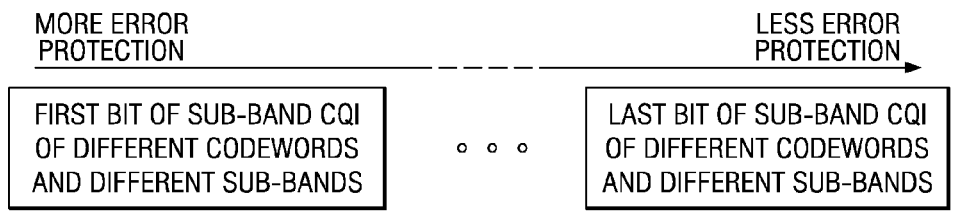

Alternatively, when reporting sub-band CQI, it is possible to give more error protection to the more significant bit of the sub-band differential CQI while give less error protection to the less significant bit of the sub-band differential CQI. Hence, an alternative format of {sub-band differential CQI} is shown in equation (11) and illustrated in FIG. 5B.

$$\{\text{sub-band differential CQI}\}=[CQI_1(2,1)' \ldots CQI_1(2,\\ L)', CQI_1(1,1)' \ldots CQI_1(1,L), \ldots CQI_x(2,1)' \ldots\\ CQI_x(2,L)', CQI_x(1,1)' \ldots CQI_x(1,L)] \quad (11)$$

Figure 5C:
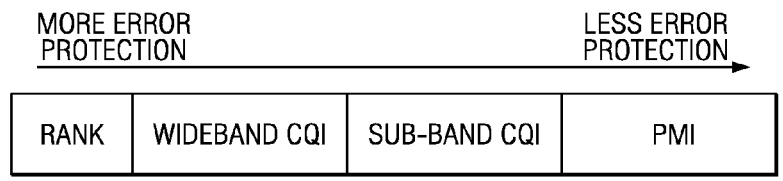

In the case where CQI is encoded jointly with rank and PMI, more error protection should be given to rank bits while less error protection should be given to PMI, as illustrated in FIG. 5C.

UE-Selected Feedback

The following values are reported to eNB:

Wideband CQI: The wideband CQI of the 1st codeword is reported with N-bits denote as [WB1'(1), WB2(1)', ..., WBN(1)']. The wideband CQI of the $2^{nd}$ codeword is reported differentially with respect to the wideband CQI of the 1st codeword using d-bits, denoted as [WB1'(2), ..., WBd(2)'].

Best-M average CQI assuming transmission over the best M sub-bands. Frequency differential quantization is applied where the difference between the best-M average CQI and the wideband CQI is sent to eNB using x-bits, x<=N. For the 1st codeword, the best-M differential CQI bit sequence is denoted as [BM1(1)', BM2(1)', ..., BMx(1)']. For the 2nd codeword, the best-M differential CQI bit sequence is denoted as [BM1(2)', BM2(2)', ..., BMx(2)'].

An indicator of the position of the selected best-M sub-band using k-bits. The bit sequence is denoted as [P1', P2', ..., Pk']

The wideband CQI should be given the most error protection because it serves as a reference and impacts the entire system bandwidth. The wideband CQI of the $1^{st}$ codeword should be given more error protection than the wideband of the $2^{nd}$ codeword, because it serves as the reference for both (1) frequency differential CQI of the $1^{st}$ codeword, and (2) wideband CQI of the $2^{nd}$ codeword, (3) best-M average CQI of the $2^{nd}$ codeword. The indication of the best-M sub-band position is less important than the wideband CQI but is more important than the best-M CQI, as it specifies where the best-M sub-band should be scheduled. If the position indicator is decoded erroneously, eNB scheduling will be sub-optimal where higher MCS is scheduled on a bandwidth part with worse channel condition and results in too aggressive link adaptation. Thus, one possible interleaver design is shown in equation (12)

$$[\{\text{wideband CQI}\}, P_1', P_2', \ldots, P_k', BM_1(2)' \ldots BM_x(2)', BM_1(1)' \ldots BM_x(1)] = [s_1', s_2', \ldots, s_n'] \quad (12)$$

where {wideband CQI} is the bit-sequence of wideband CQI given in any of equations (5)-(8) above. Alternatively, in the case where the differentially encoded best-M average CQI has a large dynamic range (e.g. when the bit-length of best-M average CQI is large) and needs more protection, another embodiment is to allocate more protection to best-M average CQI and less protection to the indicator of the position of the best-M subbands. One exemplary interleaver design is therefore given by Equation (12a)

$$[\{\text{wideband CQI}\}, BM_1(2)' \ldots BM_x(2)', BM_1(1)' \ldots BM_x(1), P_1', P_2', \ldots, P_k'] = [s_1', s_2', \ldots, s_n'] \quad (12a)$$

An alternative design is to give more error protection to the more significant bit of best-M CQI, and give less error protection to the less significant bit of best-M CQI, given as shown in equation (13).

$$[\{\text{wideband CQI}\} P_1', P_2', \ldots, P_k', BM_1(2)', BM_1(1)', BM_2(2)', BM_2(1)' \ldots BM_x(2)', \ldots BM_x(1)'] = [s_1', s_2', \ldots, s_n'] \quad (13)$$

In the case where CQI is encoded jointly with rank and PMI, more error protection should be given to rank while less error protection should be given to PMI. As a result, the interleaver could be designed as shown in equation (14) or alternatively in equation (15).

$$[R_1', \ldots, R_r', \{\text{wideband CQI}\}, P_1', P_2', \ldots, P_k', BM_1(2)' \ldots BM_x(2)', BM_1(1)' \ldots BM_x(1), PMI_1', \ldots, PMI_P'] = [s_1', s_2', \ldots, s_n'] \quad (14)$$

$$[R_1', \ldots, R_r', \{\text{wideband CQI}\}, P_1', P_2', \ldots, P_k', (2)', BM_1(2)', BM_1(1)', BM_2(2)', BM_2(1)' \ldots BM_x(2)', \ldots BM_x(1)', PMI_1', \ldots, PMI_P'] = [s_1', s_2', \ldots, s_n'] \quad (15)$$

Open-Loop MIMO SM Systems

For open-loop MIMO spatial multiplexing systems with multiple CWs multiplexed in the spatial domain, the following quantities are to be reported to the serving eNB:

The transmission rank, denoted as $[R_1', R_2', \ldots, R_r']$

The channel quality for each codeword

CQI interleaver design for open-loop MIMO SM systems could follow the similar design as proposed above, with the exception that no PMI is reported to eNB. In other words, the information bits field corresponding to rank and channel quality for both codewords is reported in the same fashion as shown above while the information bits field corresponding to the PMI is dropped.

Specific Examples of CQI Coding on PUCCH

In this section, a detailed interleaver is proposed for CQI coding on PUCCH for LTE. For CQI only, the following bit positioning is suggested for a CQI only report on PUCCH, for a single antenna port, transmit diversity, and open-loop MIMO.

Mode 1-0 Description (Wideband CQI)

[$a_0$-$a_{N-1}$] corresponds to the N-bit wideband CQI, MSB to LSB, in the subframe where wideband CQI is reported.

Mode 2-0 Description (Sub-Band CQI)

[$a_0$-$a_{N-1}$] corresponds to the N-bit best-M CQI, MSB to LSB, in the subframe where sub-band CQI is reported.

[$a_N$-$a_{N+S-1}$] corresponds to the S-bit label for the best-M sub-bands.

The following bit positioning is suggested for closed loop spatial multiplexing.

Mode 1-1 Description (Wideband CQI)

For rank-1

[$a_0$-$a_{N-1}$] correspond to the N-bit wideband CQI, MSB to LSB.

[$a_N$-$a_{N+p-1}$] correspond to the PMI, MSB to LSB.

For rank >=2 report

[$a_0$-$a_{N-1}$] correspond to the N-bit wideband CQI of the $1^{st}$ codeword, MSB to LSB.

[$a_N$-$a_{N+d-1}$] correspond to the d-bit spatial differential wideband CQI, MSB to LSB.

[$a_{N+d}$-$a_{N+d+p}$] correspond to the PMI, MSB to LSB.

Mode 2-1 description (sub-band CQI)

For rank-1

[$a_0$-$a_{N-1}$] correspond to the 4-bit best-M CQI, MSB to LSB.

[$a_N$-$a_{N+S-1}$] corresponds to the S-bit label for the best-M sub-bands.

For rank >=2

[$a_0$-$a_{N-1}$] correspond to the N-bit best-M CQI of the $1^{st}$ codeword, MSB to LSB.

[$a_N$-$a_{N+d-1}$] correspond to the 3-bit spatial differential best-M CQI, MSB to LSB.

[$a_{N+d}$-$a_{N+d+S-1}$] corresponds to the L-bit label for the best-M sub-bands.

In the subframe where wideband CQI/PMI is reported, the bit ordering follows mode 1-1 description above.

Piggybacked CQI Report on PUSCH

PUCCH-based periodic reporting is also transmitted on PUSCH when there is an UL data transmission (grant) in the same sub-frame. In this case, for the payload ranges from one to eleven bits (CQI/PMI or RI), the PUCCH-based coding and multiplexing is still used except that the resulting modulated symbols are piggybacked onto PUSCH whenever the report coincides with data transmission. As a result, the bit position discussed above is also recommended.

Figure 6:
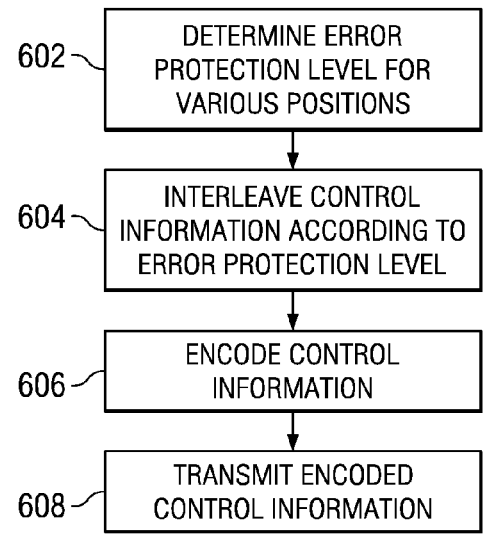
FIG. 6 is a flow diagram illustrating assignment of more important control information to locations with more error protection.

FIG. 6 is a flow diagram illustrating assignment of more important control information to locations with more error protection. As described above, with regards to FIG. 6, a determination of BER for bit position in the S' sequence is made for various bit positions and various coding schemes is performed. This may be done by simulations as described above, or by actual field measurements, for example.

Once a coding scheme is selected, the various bits and fields of the CQI control information are interleaved 604 to place the more important information is the portions of the S' sequence that have the lower error rate. This arrangement may be performed by interleaver logic such as interleaver 1 logic block 204 in FIG. 2A or 2B.

The S' sequence is then encoded 606 as described in more detail with regard to FIGS. 2A and 2B. The encoded control information is then transmitted 608 using know transmission techniques.

System Examples

Figure 7:
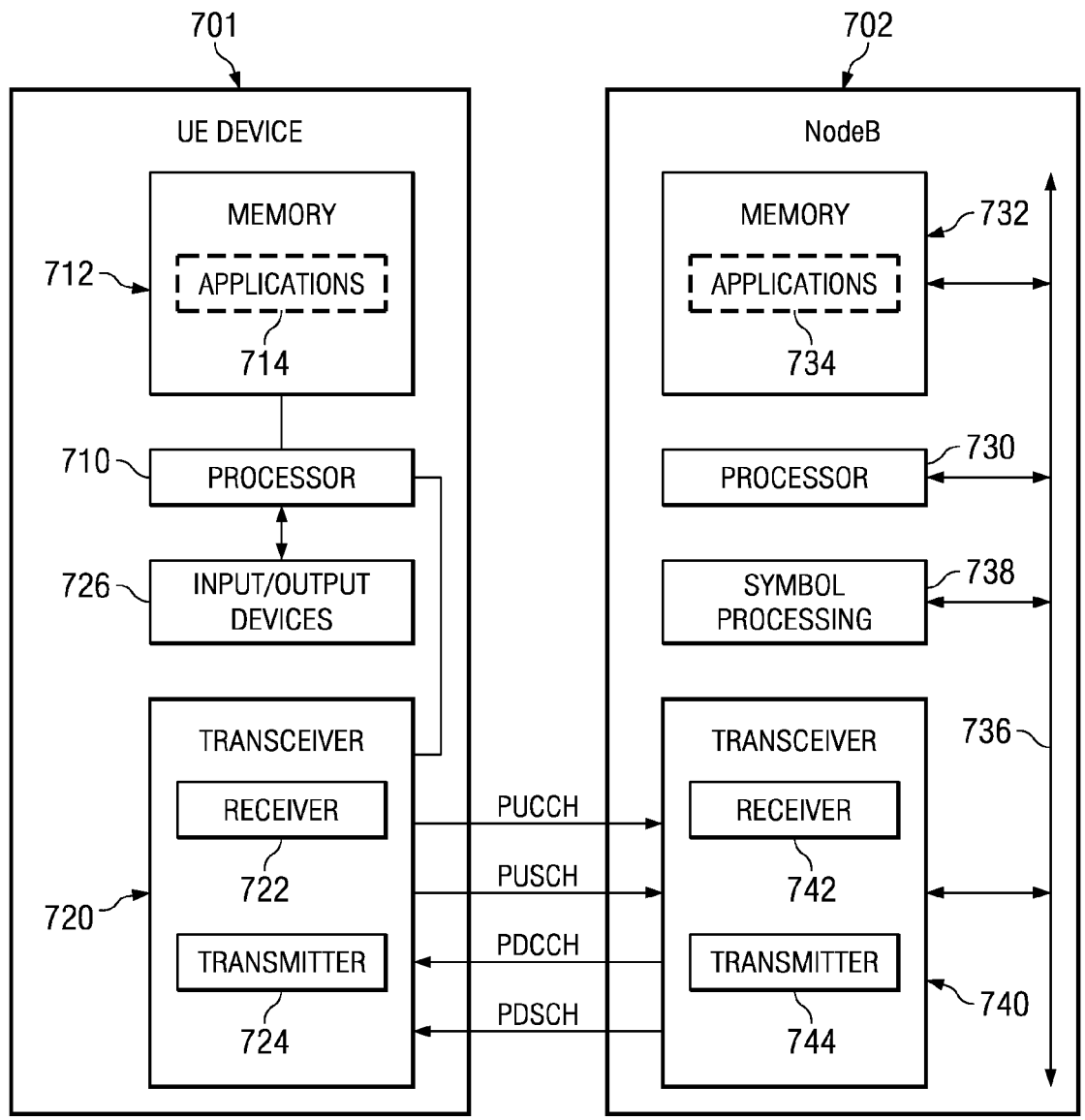
FIG. 7 is a block diagram of a Node B and a User Equipment for use in the network system of FIG. 1.

FIG. 7 is a block diagram illustrating operation of a NodeB 702 and a mobile UE 701 in the network system of FIG. 1. The mobile UE device 701 may represent any of a variety of devices such as a server, a desktop computer, a laptop computer, a cellular phone, a Personal Digital Assistant (PDA), a smart phone or other electronic devices. In some embodiments, the electronic mobile UE device 701 communicates with the NodeB 702 based on a LTE or E-UTRAN protocol. Alternatively, another communication protocol now known or later developed can be used.

As shown, the mobile UE device 701 comprises a processor 710 coupled to a memory 712 and a Transceiver 720. The memory 712 stores (software) applications 714 for execution by the processor 710. The applications could comprise any known or future application useful for individuals or organizations. As an example, such applications could be categorized as operating systems (OS), device drivers, databases, multimedia tools, presentation tools, Internet browsers, e-mailers, Voice-Over-Internet Protocol (VOIP) tools, file browsers, firewalls, instant messaging, finance tools, games, word processors or other categories. Regardless of the exact nature of the applications, at least some of the applications may direct the mobile UE device 701 to transmit UL signals to the NodeB (base-station) 702 periodically or continuously via the transceiver 720. In at least some embodiments, the mobile UE device 701 identifies a Quality of Service (QoS) requirement when requesting an uplink resource from the NodeB 702. In some cases, the QoS requirement may be implicitly derived by the NodeB 702 from the type of traffic supported by the mobile UE device 701. As an example, VOIP and gaming applications often involve low-latency uplink (UL) transmissions while High Throughput (HTP)/Hypertext Transmission Protocol (HTTP) traffic can involve high-latency uplink transmissions.

Transceiver 720 includes uplink logic which may be implemented by execution of instructions that control the operation of the transceiver. Some of these instructions may be stored in memory 712 and executed when needed by processor 710. As would be understood by one of skill in the art, the components of the Uplink Logic may involve the physical (PHY) layer and/or the Media Access Control (MAC) layer of the transceiver 720. Transceiver 720 includes one or more receivers 722 and one or more transmitters 724.

Processor 710 may send or receive data to various input/output devices 726. A subscriber identity module (SIM) card stores and retrieves information used for making calls via the cellular system. A Bluetooth baseband unit may be provided for wireless connection to a microphone and headset for sending and receiving voice data. Processor 710 may send information to a display unit for interaction with a user of the mobile UE during a call process. The display may also display pictures received from the network, from a local camera, or from other sources such as a USB connector. Processor 710 may also send a video stream to the display that is received from various sources such as the cellular network via RF transceiver 722 or the camera.

During transmission and reception of voice data or other application data, transmitter 724 sends CQI information via the PUCCH and/or the PUSCH links to the serving NodeB 702, as described in more detail above. UE 701 interleaves the control information using interleaver logic as described with respect to FIGS. 2A-2B to interleave the control information to form an ordered set of control bits, wherein more important information bits of the control information are placed into a first portion of the ordered set of control bits, with less important information bits of the control information placed into a second portion of the ordered set of controls bits. The ordered set of control bits are then encoded to form an encoded block of data. In this embodiment, the interleaver logic and encoder are embodied by executing instructions stored in memory 712 by processor 710. In other embodiments, the interleaver and encoder may be embodied by a separate processor memory unit, by a hardwired state machine, or by other types of control logic, for example.

The encoded block of data is then transmitted by transmitter 724, wherein bits from the first portion of the ordered set of control bits will statistically have a lower bit error rate (BER) than bits from the second portion of the ordered set of control bits during transmission.

NodeB 702 comprises a Processor 730 coupled to a memory 732, symbol processing circuitry 738, and a transceiver 740 via backplane bus 736. The memory stores applications 734 for execution by processor 730. The applications could comprise any known or future application useful for managing wireless communications. At least some of the applications 734 may direct the base-station to manage transmissions to or from the user device 701.

Transceiver 740 comprises an uplink Resource Manager, which enables the NodeB 702 to selectively allocate uplink PUSCH resources to the user device 701. As would be understood by one of skill in the art, the components of the uplink resource manager may involve the physical (PHY) layer and/or the Media Access Control (MAC) layer of the transceiver 740. Transceiver 740 includes a Receiver(s) 742 for receiving transmissions from various UE within range of the NodeB and transmitter(s) 744 for transmitting data and control information to the various UE within range of the NodeB.

The uplink resource manager executes instructions that control the operation of transceiver 740. Some of these instructions may be located in memory 732 and executed when needed on processor 730. The resource manager controls the transmission resources allocated to each UE that is being served by NodeB 702 and broadcasts control information via the physical downlink control channel PDCCH.

Symbol processing circuitry 738 performs demodulation and reverse rate matching using known techniques. CQI information received from UE 701 is de-interleaved using an agreed upon interleaving scheme as describe in more detail above. The specific interleaver scheme that a given UE is to use may be communicated from the NodeB to the UE via a control transmission. Alternately, interleaver parameters may be agreed upon and each UE in the network is configured accordingly in an offline manner, for example.

OTHER EMBODIMENTS

Various other embodiments of the invention will be apparent to persons skilled in the art upon reference to this description. For example, various types of foreword error correction (FEC) may be embodied to produce different types of parity bits. Block sizes may be varied according to the FEC scheme that is used and may exceed the current maximum block size of 6144 bits.

While CQI control information was described herein, embodiments of the invention may be used for transmitting other types of control information or data in which certain portions of the data may be identified as being more important than other portions of the data and can therefore be interleaved or arranged prior to encoding to place the more important information in a more protected portion of the block in which the data is being transmitted.

While a code rate of ⅓ was described herein, another embodiment may use a code rate either higher or lower than ⅓.

As used herein, the terms "applied," "coupled," "connected," and "connection" mean electrically connected, including where additional elements may be in the electrical connection path. "Associated" means a controlling relationship, such as a memory resource that is controlled by an associated port. While the invention has been described with reference to illustrative embodiments, this description is not intended to be construed in a limiting sense.

It is therefore contemplated that the appended claims will cover any such modifications of the embodiments as fall within the true scope and spirit of the invention.

What is claimed is:

1. A method for transmitting a block of control information in a wireless network, comprising:
   interleaving the control information to form an ordered set of control bits, wherein more important information bits of the control information are placed into a first portion of the ordered set of control bits, with less important information bits of the control information placed into a second portion of the ordered set of controls bits;
   encoding the ordered set of control bits to form an encoded block of data; and
   transmitting the encoded block of data, wherein bits from the first portion of the ordered set of control bits will statistically have a lower bit error rate (BER) than bits from the second portion of the ordered set of control bits during transmission.

2. The method of claim 1, further comprising:
   determining a BER for bit positions of the ordered set of information bits; and
   assigning bit positions having lower BER as the first portion and bit positions having higher BER as the second portion.

3. The method of claim 1, wherein the ordered set of control bits includes a ACK/NAK, or a rank indicator (RI), or a channel quality indicator (CQI), or a precoding matrix indicator (PMI).

4. The method of claim 3, wherein a most significant bit (MSB) of the ACK/NAK/RI/CQI/PMI is placed in the first portion and a least significant bit (LSB) of the ACK/NAK/RI/CQI/PMI is placed in the second portion.

5. The method of claim 3, wherein the ACK/NAK is placed in the first portion, and the RI or the CQI or the PMI is placed in the second portion.

6. The method of claim 3, wherein the RI is placed in the first portion and the CQI/PMI is placed in the second portion of the ordered set of control bits.

7. The method of claim 3, wherein the CQI is placed in the first portion, and the PMI is placed in the second portion.

8. The method of claim 3, wherein the CQI includes a wideband CQI being placed in the first portion, and includes at least one sub-band CQI being placed in the second portion.

9. The method of claim 3, wherein the CQI includes a wideband/sub-band CQI corresponding to a first spatial codeword being placed in the first portion, and includes a wideband/sub-band CQI corresponding to a second spatial codeword being placed in the second portion.

10. The method of claim 3, wherein the CQI includes a best-M sub-band CQI corresponding to a selected subset of M sub-bands being placed in the first portion, and includes an S-bit label of the position of the selected subset of M sub-bands being placed in the second portion.

11. A method for receiving a block of control information in a wireless network, comprising:
    receiving an encoded block of data, wherein bits from a first portion of an ordered set of control bits will statistically have a lower bit error rate (BER) than bits from a second portion of the ordered set of control bits during transmission;
    decoding the encoded block of data to form an ordered set of control bits; and
    separating the ordered set of control bits to form control information, wherein more important information bits of the control information are received in the first portion of the ordered set of control bits, with less important information bits of the control information received in the second portion of the ordered set of controls bits.

12. The method of claim 11, wherein the ordered set of control bits includes a ACK/NAK, or a rank indicator (RI), or a channel quality indicator (CQI), or a precoding matrix indicator (PMI).

13. The method of claim 12, wherein the ACK/NAK is placed in the first portion, and the RI or the CQI or the PMI is placed in the second portion.

14. The method of claim 12, wherein the RI is placed in the first portion and the CQI/PMI is placed in the second portion of the ordered set of control bits.

15. The method of claim 12, wherein the CQI is placed in the first portion and the PMI is placed in the second portion.

16. The method of claim 12, wherein the CQI includes a wideband CQI being placed in the first portion, and includes at least one sub-band CQI being placed in the second portion.

17. The method of claim 12, wherein the CQI includes a wideband/sub-band CQI corresponding to a first spatial codeword being placed in the first portion, and includes a wideband/sub-band CQI corresponding to a second spatial codeword being placed in the second portion.

18. The method of claim 12, wherein the CQI includes a best-M sub-band CQI corresponding to a selected subset of M sub-bands being placed in the first portion, and includes an S-bit label of the position of the selected subset of M sub-bands being placed in the second portion.

19. A user equipment (UE) for use in a wireless network, comprising:
    a processor coupled to a memory circuit, the memory circuit operable to store instructions for execution by the processor, the processor being controllably coupled to a receiver and to a transmitter;
    interleaving logic controlled by the processor operable to interleave a block of control information to form an ordered set of control bits, wherein more important information bits of the control information are placed into a first portion of the ordered set of control bits, with less important information bits of the control information placed into a second portion of the ordered set of controls bits;

encoding logic controlled by the processor operable to encode the ordered set of control bits to form an encoded block of data; and wherein the transmitter is operable to transmit the encoded block of data, wherein bits from the first portion of the ordered set of control bits will statistically have a lower bit error rate (BER) than bits from the second portion of the ordered set of control bits during transmission.

20. The UE of claim 19, wherein the interleaving logic is operable to place a most significant bit (MSB) of a channel quality indicator (CQI) in the first portion and to place a least significant bit (LSB) of the CQI in the second portion.

21. The UE of claim 19, wherein the interleaving logic is operable to place a wideband CQI in the first portion, and to place at least one sub-band CQI corresponding to at least one frequency sub-band in the second portion.

* * * * *